United States Patent
Jeon et al.

(10) Patent No.: US 8,692,620 B2
(45) Date of Patent: Apr. 8, 2014

(54) POWER AMPLIFIER

(75) Inventors: Moon Suk Jeon, Seoul (KR); Jung-Rin Woo, Seoul (KR); Sang Hwa Jung, Ansan (KR); Jung Hyun Kim, Uiwang (KR); Young Kwon, Thousand Oaks, CA (US); Il Do Jung, Seongnam (KR)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 52 days.

(21) Appl. No.: 13/541,049

(22) Filed: Jul. 3, 2012

(65) Prior Publication Data

US 2014/0009232 A1   Jan. 9, 2014

(51) Int. Cl.
*H03F 3/04* (2006.01)

(52) U.S. Cl.
USPC .......................... 330/297; 330/285

(58) Field of Classification Search
USPC .......................... 330/297–298, 136, 285, 296
See application file for complete search history.

(56) References Cited

U.S. PATENT DOCUMENTS

| 5,907,264 A | 5/1999 | Feldman |
| 7,193,470 B2 * | 3/2007 | Lee et al. ............. 330/285 |
| 2011/0204974 A1 | 8/2011 | Woo et al. |

FOREIGN PATENT DOCUMENTS

| JP | 2008301135 A | 12/2008 |
| WO | WO2006066461 A1 | 6/2006 |

OTHER PUBLICATIONS

Wu, "A Two-Phase Switching Hybrid Supply Modulator for RF Power Amplifiers With 9% Efficiency Improvement", IEEE Journal of Solid-State Circuits, vol. 45, No. 12, Dec. 2010, p. 2543-2556.

* cited by examiner

*Primary Examiner* — Hieu Nguyen

(57) ABSTRACT

A power amplifier including a MOSFET including a source supplied with a first DC power, a gate connected to an RF input signal, and a drain connected to a power supply terminal of an RF power amplification unit; a supply voltage modulation control unit that determines a DC gate voltage of the MOSFET based on an envelope of the RF input signal; and a bypass circuit connected between the drain and the power supply terminal. The MOSFET outputs a second DC power via the drain and amplifies the RF input signal based on a third DC power substantially identical to a differential between the first and the second DC power, and also outputs an RF power via the drain. The bypass circuit receives and rectifies the RF power to supply a recycled DC power to the power supply terminal of the RF power amplification unit.

18 Claims, 4 Drawing Sheets

POWER AMPLIFIER

BACKGROUND

The inventive concepts described herein are generally related to a power amplifier, and more particularly, to a power amplifier having improved efficiency when operating in a back-off power region.

There is an increasing demand in the industry to provide wireless communication systems capable of achieving high data transfer rates with limited frequency resources. Efforts have been thus been made to optimize modulation schemes used in wireless communication systems to meet such demand. The optimization of modulation schemes has been intended to achieve an increase in the peak to average power ratio (PAPR) of signals transmitted by wireless communication systems.

In order to maintain good linearity, power amplifiers transmitting signals with a high PAPR inevitably operate in a back-off power region more frequently than when transmitting signals with low PAPR. However, frequent operation in the back-off power region may reduce operating efficiency of power amplifiers. Accordingly, there has arisen a demand for a power amplifier that operates with high efficiency in the back-off power region while maintaining good linearity. To meet this demand, research has focused on supply voltage modulated power amplifiers.

Typically, supply voltage modulated power amplifiers are configured to include a radio frequency (RF) power amplification unit that amplifies an RF input signal and outputs an amplified signal, and a supply voltage modulation unit that modifies a bias voltage supplied to the RF power amplification unit based on amplitude of the RF input signal. Since the supplied bias voltage can be reduced when the amplitude of the RF input signal is small, supply voltage modulated power amplifiers may be more efficient than power amplifiers that apply a fixed-value bias voltage to corresponding RF power amplification units. Moreover, since the linearity of the supply voltage modulated power amplifiers are mainly influenced by the supply voltage modulation unit and not by an RF power amplification unit, the use of supply voltage modulated power amplifiers help to simplify and enable design of power amplifiers having high efficiency.

FIG. 4 is a schematic view illustrating the configuration of a conventional supply voltage modulated power amplifier. Supply voltage modulated power amplifier 100 includes an RF power amplification unit 110 that amplifies an RF input signal, and a supply voltage modulation unit 120 that modulates a bias voltage supplied to the RF power amplification unit 110 based on an envelope signal obtained responsive to the peak values of the RF input signal. Supply voltage modulation unit 120 includes a DC-to-DC converter that converts the bias voltage.

However, in the case of using a DC-to-DC converter in supply voltage modulation unit 120, the efficiency of RF power amplifier unit 110 of supply voltage modulated power amplifier 100 may decrease depending on the bandwidth of the RF input signal. Normally, the overall efficiency of supply voltage modulated power amplifier 100 may be defined as (efficiency of RF power amplification unit 110)×(efficiency of supply voltage modulation unit 120). As the bandwidth of the RF input signal increases, the efficiency of supply voltage modulation unit 120 including the DC-to-DC converter decreases, resulting in a decrease in the overall efficiency of supply voltage modulated power amplifier 100. Consequently, when supply voltage modulated power amplifier 100 is used in a wireless communication system with a broad band envelope signal, such as Wideband-Code Division Multiple Access (WCDMA) or Long Term Evolution (LTE) systems, the level of improvement in overall efficiency tends to be limited due to a reduction in the efficiency of the DC-to-DC converter.

Additionally, when the DC-to-DC converter within supply voltage modulation unit 120 is switched on and off, switching noise may appear in the output of supply voltage modulated power amplifier 100, adversely influencing operation of the wireless communication system.

Furthermore, the DC-to-DC converter within supply voltage modulation unit 120 typically includes an inductor having an inductance ranging from hundreds of nH to a few uH. It can be difficult to integrate the inductor into a single chip due to the size of the inductor. Moreover, when a low-loss inductor which is relatively large and thick is used to improve efficiency, an increase in the size of the entire circuit may be concomitantly required. These factors contribute to difficulties in developing wireless communication systems of desired compact size.

Accordingly, there has been a need to develop a supply voltage modulated power amplifier capable of overcoming the deficiencies present in conventional power amplifiers employing a DC-to-DC converter, and to provide a power amplifier capable of achieving high operating efficiency in a back-off power region.

BRIEF DESCRIPTION OF THE DRAWINGS

The example embodiments are best understood from the following detailed description when read with the accompanying drawing figures. Whenever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The configurations and operations of power amplifiers in accordance with the representative embodiments will be described with reference to FIGS. 1 to 3.

Figure 1:
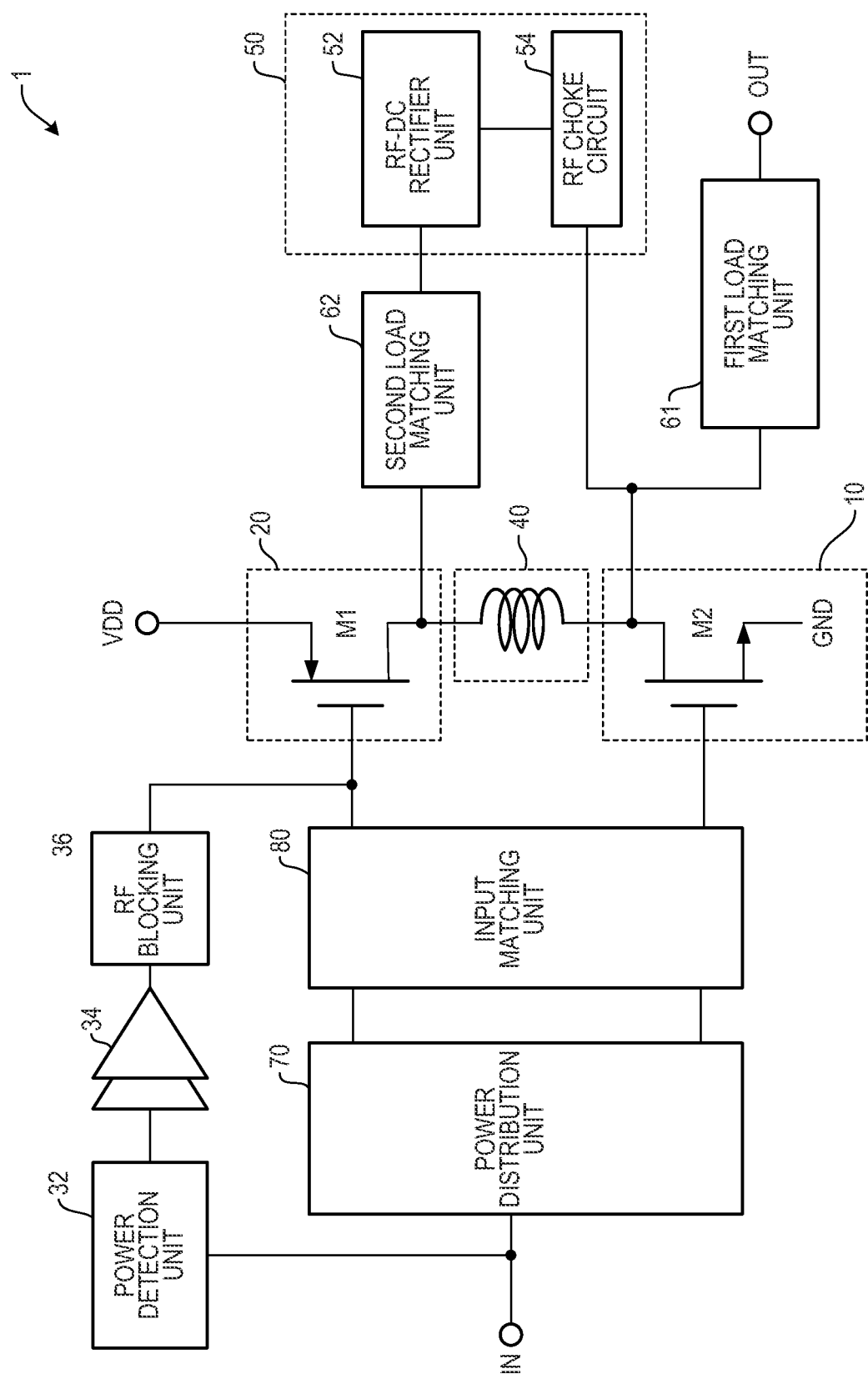
FIG. 1 is a schematic block diagram illustrating the configuration of a power amplifier, according to a representative embodiment.

FIG. 1 is a schematic block diagram illustrating the configuration of a power amplifier, according to a representative embodiment.

Referring to FIG. 1, power amplifier 1 includes RF power amplification unit 10, metal-oxide semiconductor field-effect transistor (MOSFET) 20, power detection unit 32, supply voltage modulation control unit 34, interference prevention unit 40, and bypass circuit 50.

An input terminal of RF power amplification unit 10 is connected to an input terminal IN of power amplifier 1. A power supply terminal of RF power amplification unit 10 is connected to a drain of MOSFET 20, an output terminal of bypass circuit 50, and an output terminal OUT of power amplifier 1. RF power amplification unit 10 amplifies an RF input signal received from the input terminal IN of power amplifier 1 and outputs an amplified RF signal to the output terminal OUT of power amplifier 1.

In this representative embodiment, RF power amplification unit 10 is implemented by using a negative-channel metal-oxide semiconductor (NMOS) transistor. In this case, a source of the NMOS transistor is grounded, a gate of the NMOS transistor is the input terminal of RF power amplification unit 10, and a drain of the NMOS transistor is the power supply terminal of RF power amplification unit 10.

Alternatively, in some embodiments RF power amplification unit 10 may be implemented by using a field-effect transistor (FET) instead of an NMOS transistor. Further, the RF power amplification unit 10 may be implemented by using a bipolar junction transistor (BJT) instead of a FET.

Figure 2:
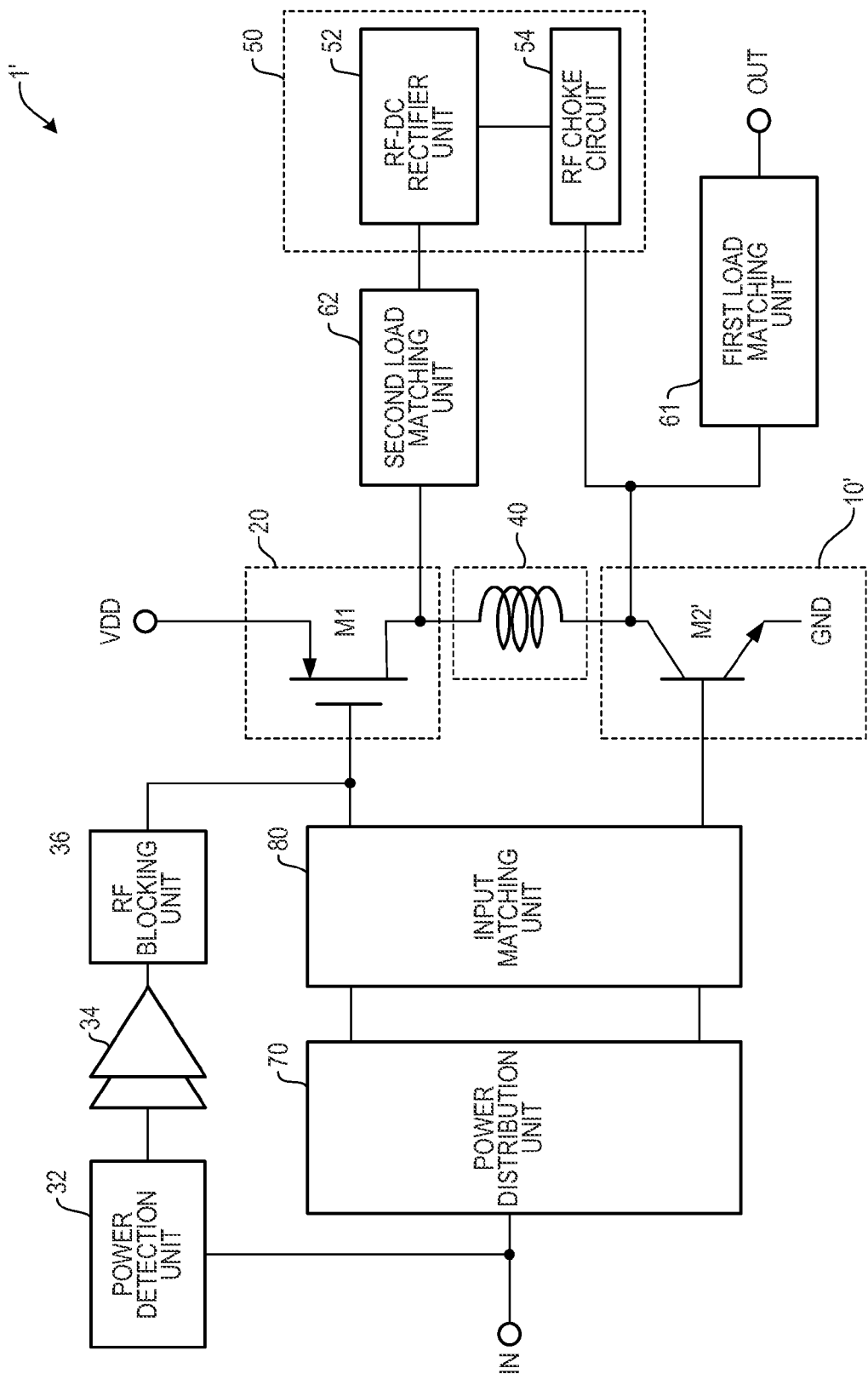
FIG. 2 is a schematic block diagram illustrating the configuration of a power amplifier, according to another representative embodiment.
Figure 3:
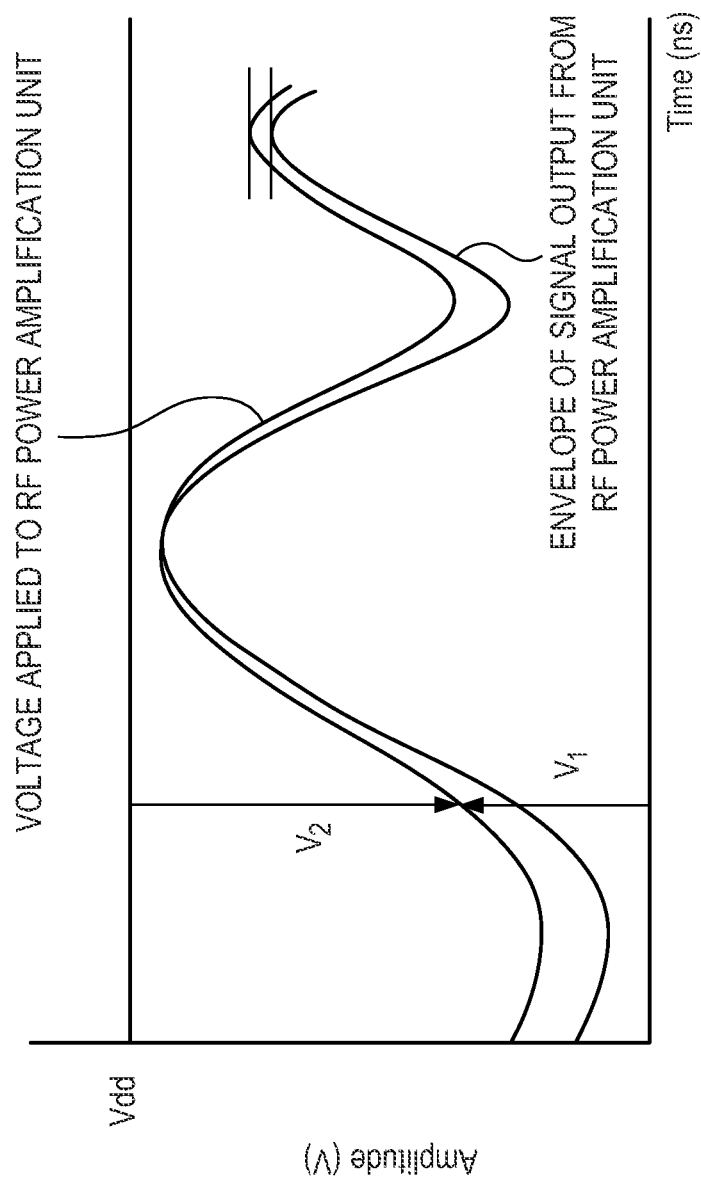
FIG. 3 is a graph depicting the relationship between the voltage applied to the RF power amplification units of the power amplifiers of FIGS. 1 and 2, and the voltage applied to a MOSFET.
Figure 4:
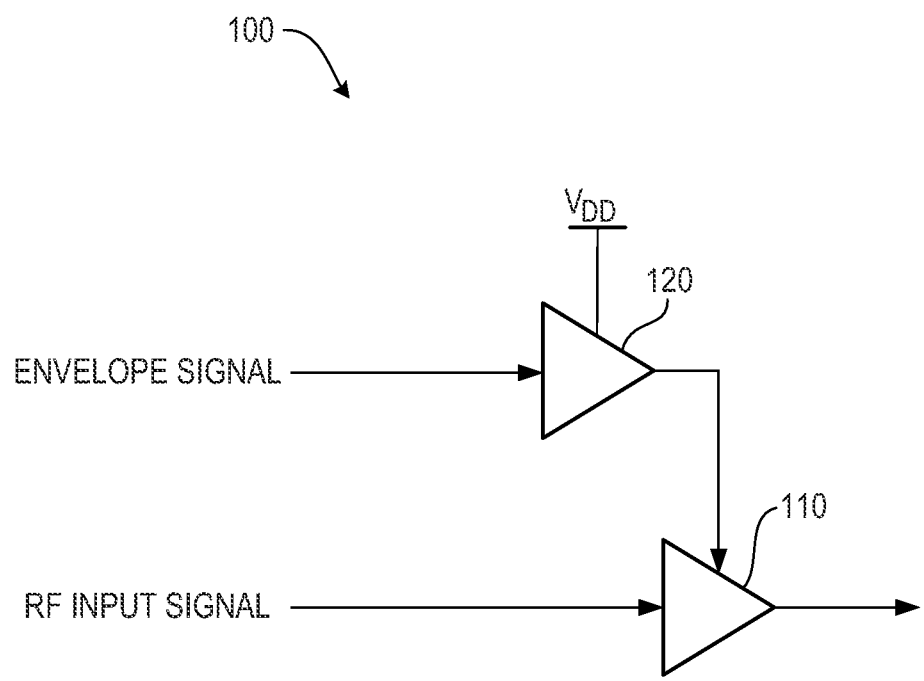
FIG. 4 is a schematic view illustrating the configuration of a conventional supply voltage modulated power amplifier.

FIG. 2 is a schematic block diagram illustrating the configuration of a power amplifier 1', according to another representative embodiment.

As shown in FIG. 2, RF power amplification unit 10' of power amplifier 1' is implemented by using a BJT. In RF power amplification unit 10', an emitter of the BJT is grounded, a base of the BJT is an input terminal of RF power amplification unit 10', and a collector of the BJT is a power supply terminal of RF power amplification unit 10'. Since the overall configurations of power amplifier 1 in FIG. 1 and power amplifier 1' in FIG. 2 are the same except for RF power amplification unit 10 and 10', the following description will focus on power amplifier 1 shown in FIG. 1 and description of similar components in power amplifier 1' shown in FIG. 2 will be omitted.

Turning to the representative embodiment shown in FIG. 1, power amplifier 1 may further include first load matching unit 61 connected between the power supply terminal of RF power amplification unit 10 and the output terminal OUT of power amplifier 1, so as to increase the output, efficiency, and gain of the amplified RF signal.

As further shown in FIG. 1, a source of MOSFET 20 is connected to a power supply terminal VDD of power amplifier 1. The drain of the MOSFET 20 is connected to the power supply terminal of RF power amplification unit 10 and an input terminal of bypass circuit 50. A gate of MOSFET 20 is connected to the input terminal IN of power amplifier 1 and an output terminal of supply voltage modulation control unit 34. MOSFET 20 outputs, via a drain thereof, a part of the DC power supplied via the source thereof depending on a DC gate voltage supplied to the gate of MOSFET 20 from supply voltage modulation control unit 34. Further, as will be later described in further detail, MOSFET 20 amplifies the RF input signal received via the gate thereof based on the other part of the DC power which is substantially identical to a differential between the DC power and the part of the DC power, and outputs an RF power in the form of the amplified signal via the drain thereof. In this embodiment, MOSFET 20 is a positive-channel metal-oxide semiconductor (PMOS) transistor.

An input terminal of power detection unit 32 is connected to the input terminal IN of power amplifier 1, and an output terminal of power detection unit 32 is connected to an input terminal of supply voltage modulation control unit 34. Power detection unit 32 detects the RF input signal received from the input terminal IN of power amplifier 1, and generates an envelope signal based on each of peak values of the RF input signal. The envelope signal may be modulated by amplification or the like, prior to being output to supply voltage modulation control unit 34.

The input terminal of supply voltage modulation control unit 34 is connected to the output terminal of power detection unit 32, and the output terminal of supply voltage modulation control unit 34 is connected to the gate of MOSFET 20. Supply voltage modulation control unit 34 receives the envelope signal from power detection unit 32, and outputs a modulation control signal based on the received envelope signal. The output modulation control signal is input to the gate of MOSFET 20. Supply voltage modulation control unit 34 determines the DC gate voltage applied to the gate of MOSFET 20 by using the modulation control signal.

Although not shown in FIGS. 1 and 2, the voltage of the drain of MOSFET 20 may be fed back to supply voltage modulation control unit 34, so that a closed loop can be formed. Further, supply voltage modulation control unit 34 may be implemented to include an operational amplifier (OP-Amp) or an operational transconductance amplifier (OTA), although depiction thereof is omitted for ease of illustration.

RF blocking unit 36 may be disposed as connected to the output terminal of supply voltage modulation control unit 34. RF blocking unit 36 blocks the propagation of the RF input signal received at the input terminal IN of power amplifier 1 from being distributed to the gate of MOSFET 20, RF blocking unit 36 may be implemented by using an inductor or a resistor.

Interference prevention unit 40 is connected between the drain of MOSFET 20 and the power supply terminal of RF power amplification unit 10. Interference prevention unit 40 blocks an RF-type signal, thereby preventing amplification by MOSFET 20 and amplification by RF power amplification unit 10 from interfering with each other. Interference prevention unit 40 also blocks RF power output from the drain of MOSFET 20, so that the RF power propagates only to an input terminal of bypass circuit 50. Interference prevention unit 40 passes DC power output from the drain of MOSFET 20 therethrough, thereby allowing supply voltage $V_1$ to be applied to the power supply terminal of RF power amplification unit 10. Interference prevention unit 40 may be implemented using an inductor.

The input terminal of bypass circuit 50 is connected to the drain of MOSFET 20, and the output terminal of bypass circuit 50 is connected to the power supply terminal of RF power amplification unit 10. Bypass circuit 50 receives and rectifies the RF power output from the drain of MOSFET 20, and supplies a recycled DC power generated by the rectification to the power supply terminal of RF power amplification unit 10. The bypass circuit 50 includes RF-DC rectifier circuit 52, and RF choke circuit 54 connected in series to the output terminal of RF-DC rectifier circuit 52. RF choke circuit 54 may be an inductor. Power amplifier 1 may further include second load matching unit 62 connected between the drain of MOSFET 20 and the input terminal of bypass circuit 50, to increase the output, efficiency, and gain of the amplified RF signal.

Although the RF input signal from the input terminal IN may be configured to be input to MOSFET 20 and RF power amplification unit 10 without predetermined signal processing, power distribution unit 70 may be further included as shown in FIG. 1. Power distribution unit 70 may include a coupler or a power splitter. Power distribution unit 70 may further include an amplifier or a limiter to amplify the RF input signal input to the gate of MOSFET 20 and/or the input terminal of RF power amplification unit 10. Additionally, to obtain the desired RF gain, input matching unit 80 may be included as connected to the gate of MOSFET 20 and the input terminal of RF power amplification unit 10.

Hereinafter, the operation of power amplifier 1 and power amplifier 1' according to the representative embodiments shown in FIGS. 1 and 2 will be described.

When the RF input signal is received via the input terminal IN of power amplifier 1 (1'), power detection unit 32 detects the amplitude of the received RF input signal and outputs the envelope signal. The output envelope signal is input to supply voltage modulation control unit 34. Then, supply voltage modulation control unit 34 outputs a modulation control signal based on the envelope signal. The modulation control signal is input to the gate of MOSFET 20, and determines the DC gate voltage of MOSFET 20. Then, the voltage ($V_1$ of FIG. 3) output via the drain of MOSFET 20 is determined based on the DC gate voltage of MOSFET 20. The determined voltage $V_1$ is applied to RF power amplification unit 10 (10') as a bias voltage. At the same time, a residual voltage ($V_2$ of FIG. 3) corresponding to the differential between a power supply voltage (Vdd of FIG. 3) supplied from the power supply terminal VDD of power amplifier 1 and the bias voltage $V_1$ is applied to MOSFET 20. Accordingly, the part of the DC power supplied to the source of MOSFET 20 is output via the drain of MOSFET 20, and the other part of the DC power, which is substantially identical to the differential between the DC power supplied via the source of MOSFET 20 and the part of the DC power output via the drain of MOSFET 20, is supplied to MOSFET 20.

Meanwhile, the RF input signal received via the input terminal IN of power amplifier 1 (1') propagates to the gate of MOSFET 20 and the input terminal of RF power amplification unit 10 (10'). Prior to being input to the gate of MOSFET 20 and the input terminal of RF power amplification unit 10 (10'), the RF input signal may be subjected to power distribution by means of power distribution unit 70 and/or input matching by means of input matching unit 80.

MOSFET 20 amplifies the RF input signal input to the gate thereof based on the other part of the DC power, and outputs an amplified RF power to the drain of MOSFET 20.

Of the DC power and the RF power output via the drain of MOSFET 20, the part of the DC power is supplied to the power supply terminal of RF power amplification unit 10 (10') through interference prevention unit 40, while the amplified RF power does not pass through interference prevention unit 40 and therefore is supplied to bypass circuit 50. The amplified RF power supplied to bypass circuit 50 is converted into the recycled DC power having the bias voltage $V_1$ by RF-DC rectifier circuit 52, and is injected to the power supply terminal of RF power amplification unit 10 (10'). RF power amplification unit 10 (10') receives the part of the DC power from the drain of MOSFET 20 and the recycled DC power from bypass circuit 50, amplifies the RF input signal received via the input terminal thereof, and outputs the amplified RF signal to the output terminal OUT of power amplifier 1 (1').

In the above-described power amplifier 1 (1') in accordance with the representative embodiments, an amount of power corresponding to the residual voltage ($V_2$ of FIG. 3) is reused by RF power amplification unit 10 (10') to perform amplification, and therefore the power efficiency of the overall power amplifier 1 (1') is improved.

Furthermore, since power amplifier 1 (1') is implemented using a MOSFET instead of a DC-to-DC converter, the problems of conventional envelope elimination and restoration (EER) power amplifiers and envelope tracking (ET) power amplifiers associated with having a supply voltage modulation control unit including a DC-to-DC converter may be avoided. That is, situations where the efficiency of the supply voltage modulation control unit decreases as the bandwidth of the envelope signal increases may be avoided.

In addition, noise attributable to the on/off switching of the DC-to-DC converter can be reduced, and factors that hamper the small-sized implementation of a wireless communication systems, for example the addition of inductor (especially, a low-loss inductor) for improving the efficiency of the DC-to-DC converter, can be eliminated.

Although a limited number of transistors and limited types of components have been used in the description of the power amplifiers in accordance with the representative embodiments, a larger number of transistors or other types of components may be employed without departing from the spirit and scope of the teachings disclosed herein.

The concepts disclosed in accordance with the representative embodiments can be advantageously applied for use with RF power amplification devices, and communication apparatuses and systems using the RF power amplification devices. In particular, the disclosed concepts can be advantageously applied for use with power amplification devices and wireless systems using the power amplification devices, such as cellular handsets, mobile Internet devices, and a personal digital assistants (PDAs).

In addition, the concepts disclosed in accordance with the representative embodiments can be applied for use with communication systems that adopt a communication method requiring high linearity, such as High Speed Downlink Packet Access (HSDPA), High Speed Uplink Packet Access (HSUPA), Enhanced Data rates for GSM Evolution (EDGE), Long Term Evolution (LTE)/4G, WiFi, Worldwide interoperability for Microwave access (WiMax), Code Division Multiple Access (CDMA), and Wideband-Code Division Multiple Access (WCDMA) systems.

The above-described power amplifiers in accordance with the representative embodiments may be configured to rectify RF power output from a MOSFET into DC power, and inject the DC power to an RF power amplification unit. Therefore, the power efficiency of a power amplifier that operates in a back-off power region can be improved. Furthermore, power amplifiers in accordance with the representative embodiments can replace supply voltage modulated power amplifiers having DC-to-DC converters. Therefore, the power amplifiers in accordance with the representative embodiments can maintain operating efficiency even when the bandwidth of an envelope signal increases. Moreover, the problems of switching noise and the corresponding large size of an apparatus attributable to a DC-to-DC converter can be mitigated.

While the representative embodiments have been shown and described with respect to the corresponding figures, it will be understood by those skilled in the art that various changes and modifications may be made without departing from the spirit and scope of the invention as defined in the following claims.

What is claimed is:

1. A power amplifier for receiving and amplifying a radio frequency (RF) input signal and outputting an amplified RF signal, the power amplifier comprising:
   an RF power amplification unit configured to amplify the RF input signal;
   a metal-oxide semiconductor field-effect transistor (MOSFET) configured as having a source supplied with a first direct current (DC) power, a gate that receives the RF input signal, and a drain connected to a power supply terminal of the RF power amplification unit;
   a power detection unit configured to detect an amplitude of the RF input signal and generate an envelope signal based on the detected amplitude;
   a supply voltage modulation control unit configured to determine a DC gate voltage of the MOSFET based on the envelope signal; and
   a bypass circuit including a first end connected to the drain of the MOSFET and a second end connected to the power supply terminal of the RF power amplification unit,
   wherein the MOSFET outputs a second DC power via the drain based on the DC gate voltage, the second DC power being lower than the first DC power,
   wherein the MOSFET amplifies the RF input signal based on a third DC power which has a magnitude substantially identical to a differential between the first DC power and the second DC power, and outputs an RF power via the drain thereof, and
   wherein the bypass circuit receives and rectifies the RF power output from the drain of the MOSFET, and supplies a recycled DC power to the power supply terminal of the RF power amplification unit responsive to the rectifying.

2. The power amplifier of claim 1, wherein the MOSFET is a positive-channel metal-oxide semiconductor (PMOS).

3. The power amplifier of claim 1, wherein the bypass circuit comprises a rectifier circuit.

4. The power amplifier of claim 3, wherein the bypass circuit further comprises a RF choke circuit connected to an output terminal of the rectifier circuit.

5. The power amplifier of claim 4, wherein the RF choke circuit is an inductor.

6. The power amplifier of claim 4, wherein the rectifier circuit and the RF choke circuit are connected in series to each other.

7. The power amplifier of claim 1, further comprising an interference prevention unit connected between the drain of the MOSFET and the power supply terminal of the RF power amplification unit.

8. The power amplifier of claim 7, wherein the interference prevention unit comprises an inductor.

9. The power amplifier of claim 1, wherein the RF power amplification unit comprises a field-effect transistor (FET).

10. The power amplifier of claim 1, wherein the RF power amplification unit comprises a bipolar junction transistor (BJT).

11. A power amplifier comprising:
    an amplification unit configured to provide an amplified RF signal as an output of the power amplifier responsive to an RF input signal;
    a power detector configured to provide an envelope signal responsive to the RF input signal;
    a supply voltage controller configured to provide a direct current (DC) gate voltage responsive to the envelope signal;
    a transistor connected to a first DC power and configured to provide a second DC power and amplified RF power responsive to the DC gate voltage and the RF input signal; and
    a bypass circuit configured to rectify the amplified RF power and provide recycled DC power to the power supply terminal of the amplification unit.

12. The power amplifier of claim 11, wherein the transistor is a metal-oxide semiconductor field-effect transistor configured to have a gate connected to the DC gate voltage and the RF input signal, a source connected to the first DC power and a drain connected to the power supply terminal of the amplification unit.

13. The power amplifier of claim 11, wherein the transistor amplifies the RF input signal based on a third DC power which has a magnitude substantially identical to a differential between the first DC power and the second DC power.

14. The power amplifier of claim 11, wherein the bypass circuit comprises:
    a rectifier connected to the amplified RF power; and
    an RF choke configured to provide the recycled DC power responsive to an output of the rectifier.

15. The power amplifier of claim 11, wherein the amplification unit comprises a field-effect transistor.

16. The power amplifier of claim 11, wherein the amplification unit comprises a bipolar junction transistor.

17. The power amplifier of claim 11, further comprising an interference prevention unit connected between the amplification unit and the transistor, and configured to prevent amplification by the amplification unit and amplification by the transistor from interfering with each other.

18. The power amplifier of claim 17, wherein the interference prevention unit comprises an inductor.

* * * * *